United States Patent
Iwayama et al.

(10) Patent No.: US 9,306,152 B2
(45) Date of Patent: Apr. 5, 2016

(54) MAGNETIC MEMORY AND METHOD FOR MANUFACTURING THE SAME

(71) Applicants: Masayoshi Iwayama, Seoul (KR); Hiroyuki Kanaya, Seoul (KR)

(72) Inventors: Masayoshi Iwayama, Seoul (KR); Hiroyuki Kanaya, Seoul (KR)

(73) Assignee: KABUSHIKI KAISHA TOSHIBA, Tokyo (JP)

(*) Notice: Subject to any disclaimer, the term of this patent is extended or adjusted under 35 U.S.C. 154(b) by 0 days.

(21) Appl. No.: 14/322,631

(22) Filed: Jul. 2, 2014

(65) Prior Publication Data

US 2015/0255706 A1   Sep. 10, 2015

Related U.S. Application Data

(60) Provisional application No. 61/950,553, filed on Mar. 10, 2014.

(51) Int. Cl.
*H01L 29/82* (2006.01)
*H01L 43/02* (2006.01)
*H01L 43/12* (2006.01)

(52) U.S. Cl.
CPC .............. *H01L 43/02* (2013.01); *H01L 43/12* (2013.01)

(58) Field of Classification Search
CPC ........ H01L 27/222; H01L 43/12; H01L 43/02
USPC ........................................... 257/421
See application file for complete search history.

(56) References Cited

U.S. PATENT DOCUMENTS

| 8,089,803 | B2 | 1/2012 | Katou | |
| 8,456,893 | B2* | 6/2013 | Horng et al. | 365/158 |
| 9,000,545 | B2* | 4/2015 | Kajiyama | 257/421 |
| 2012/0217594 | A1 | 8/2012 | Kajiyama | |
| 2013/0155761 | A1 | 6/2013 | Aoki | |

FOREIGN PATENT DOCUMENTS

JP    2013153232 A    8/2013

OTHER PUBLICATIONS

U.S. Appl. No. 61/952,801, filed Mar. 13, 2014, First Named Inventor: Hiroyuki Kanaya, Title: "Magnetic Memory and Method for Manufacturing the Same".

* cited by examiner

*Primary Examiner* — Douglas Menz
(74) *Attorney, Agent, or Firm* — Holtz, Holtz & Volek PC

(57) ABSTRACT

According to one embodiment, a magnetic memory is disclosed. The magnetic memory includes an underlying structure having conductivity provided on the substrate and including a first layer with a polycrystalline structure and a second layer with an amorphous structure, and a magnetoresistive element provide on the underlying layer. The magnetoresistive element includes a first magnetic layer provided on the underlying layer, a non-magnetic layer provided on the first magnetic layer, and a second magnetic layer provided on the non-magnetic layer.

14 Claims, 8 Drawing Sheets

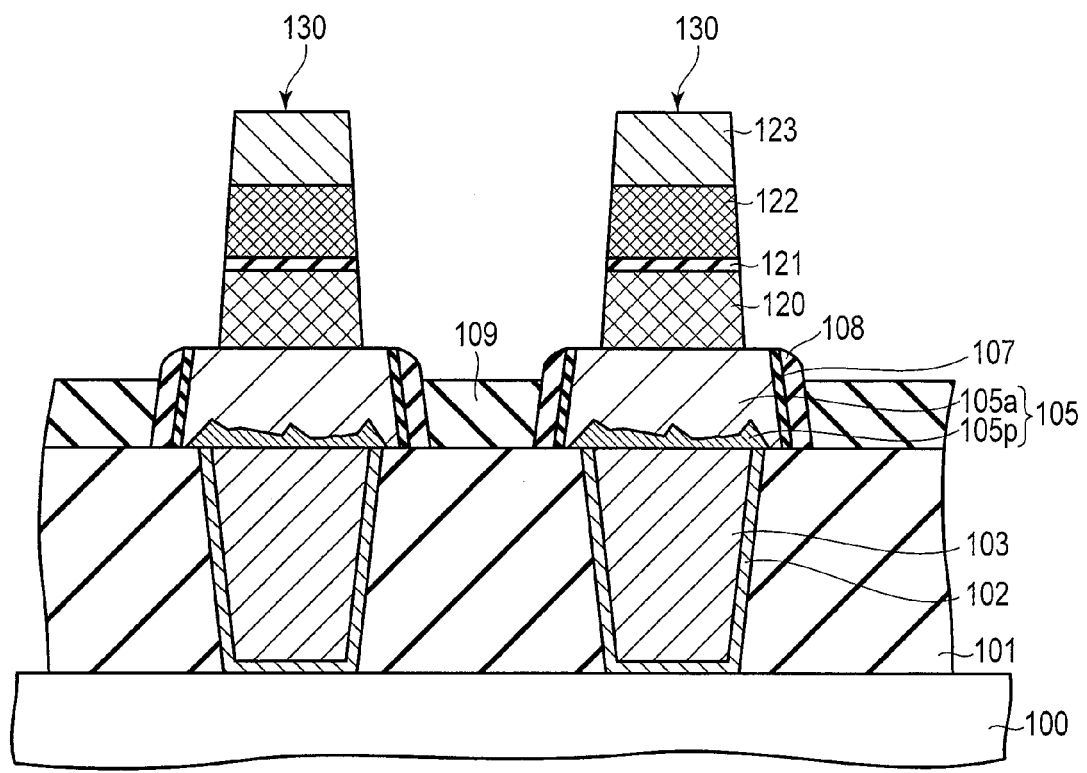
F I G. 7

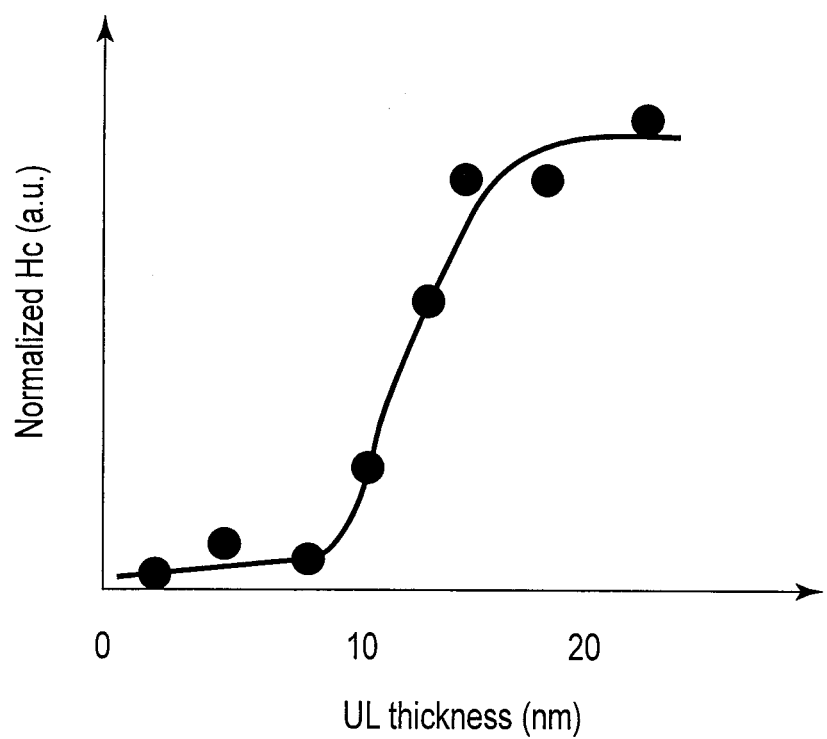
F I G. 10

MAGNETIC MEMORY AND METHOD FOR MANUFACTURING THE SAME

CROSS-REFERENCE TO RELATED APPLICATIONS

This application claims the benefit of U.S. Provisional Application No. 61/950,553, filed Mar. 10, 2014, the entire contents of which are incorporated herein by reference.

FIELD

Embodiments described herein relate generally to a magnetic memory and a method for manufacturing the same.

BACKGROUND

In recent years, a semiconductor memory utilizing a resistance variable element as a memory element, such as a PRAM (phase-change random access memory) or an MRAM (magnetic random access memory), has been attracting attention and being developed. The MRAM is a device which performs a memory operation by storing "1" or "0" information in a memory cell by using a magnetoresistive effect, and has features of nonvolatility, high-speed operation, high integration and high reliability.

One of magnetoresistive effect elements is a magnetic tunnel junction (MTJ) element including a three-layer multilayer structure of a storage layer having a variable magnetization direction, an insulation film as a tunnel barrier, and a reference layer which maintains a predetermined magnetization direction.

The resistance of the MTJ element varies depending on the magnetization directions of the storage layer and the reference layer, it takes a minimum value when the magnetization directions are parallel, and takes a maximum value when the magnetization directions are antiparallel, and information is stored by associating the parallel state and antiparallel state with binary information "0" and binary information "1", respectively.

Writing of information into the MTJ element involves a magnetic-field write scheme in which only the magnetization direction in the storage layer is reversed by a current magnetic field that is generated when a current flowing is flowed through a write line, and a write (spin injection write) scheme using spin angular momentum movement in which the magnetization direction in the storage layer is reversed by passing a spin polarization current through the MTJ element itself.

In the former scheme, when the element size is reduced, the coercivity of a magnetic body constituting the storage layer increases and the write current tends to increase, and thus it is difficult to achieve both the miniaturization and low electric current.

On the other hand, in the latter scheme (spin injection write scheme), spin polarized electron to be injected into the MTJ element decreases with the decrease of the volume of the magnetic layer constituting the storage layer, so that it is expected that both the miniaturization and low electric current may be easily achieved.

BRIEF DESCRIPTION OF THE DRAWINGS

FIG. 7 is a cross-sectional view for illustrating the method for manufacturing the magnetic memory following FIG. 6;

FIG. 10 is a graph showing a result of a research of a relationship between a thickness of an underlying layer and a standardized coersive force Hc of a first magnetic layer.

DETAILED DESCRIPTION

Figure 1:
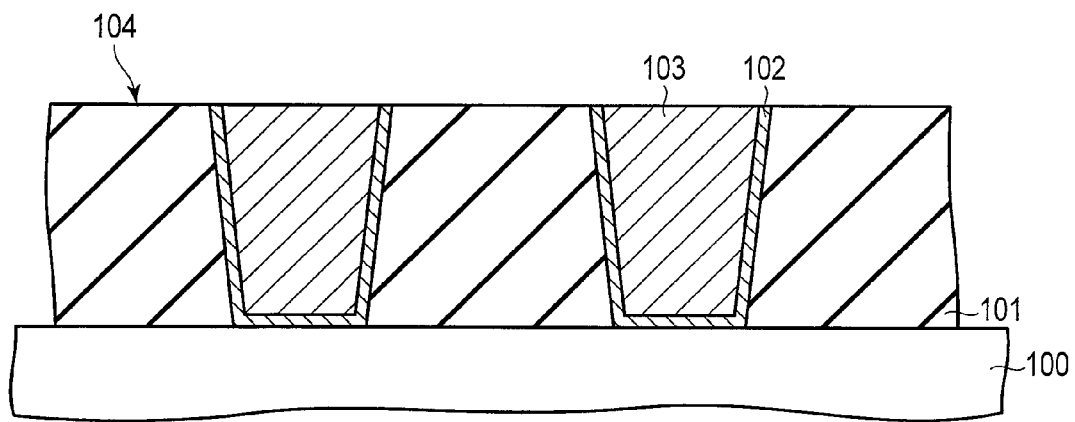
FIG. 1 is a cross-sectional view for illustrating a method for manufacturing a magnetic memory of an embodiment.
Figure 2:
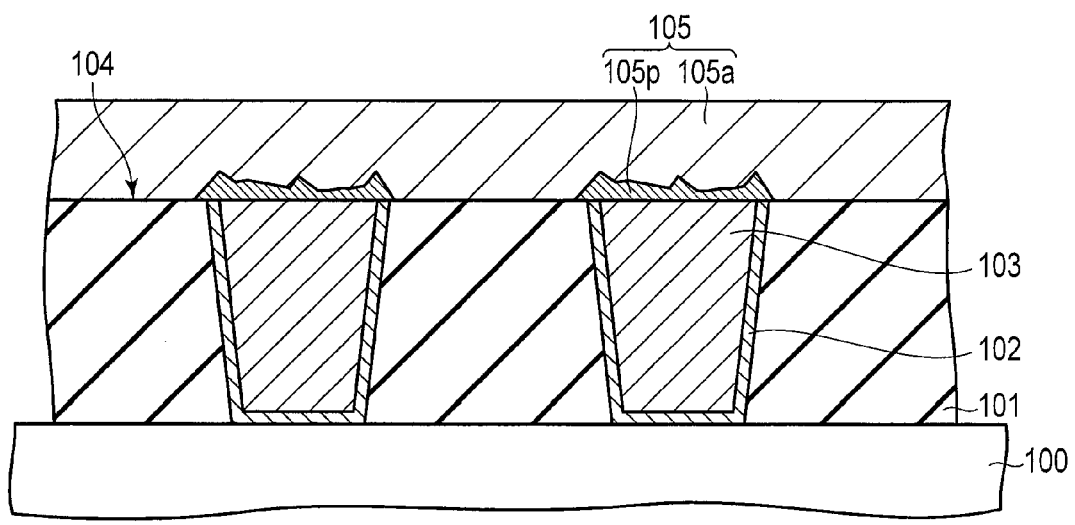
FIG. 2 is a cross-sectional view for illustrating the method for manufacturing the magnetic memory following FIG. 1.

In general, according to one embodiment, a magnetic memory is described. The magnetic memory includes an underlying structure having conductivity provided on the substrate and including a first layer with a polycrystalline structure and a second layer with an amorphous structure, and a magnetoresistive element provide on the underlying layer. The magnetoresistive element includes a first magnetic layer provided on the underlying layer, a non-magnetic layer provided on the first magnetic layer, and a second magnetic layer provided on the non-magnetic layer.

In general, according to one embodiment, a method for manufacturing a magnetic memory including a substrate and a magnetoresistive element provided on the substrate is described. The method includes forming a conductive underlying layer on the substrate. The underlying layer includes a first layer having a polycrystalline structure and a second layer having an amorphous structure provided on the first layer. The method further includes forming a first magnetic layer on the underlying layer, forming a non-magnetic layer on the first magnetic layer, and forming a second magnetic layer on the non-magnetic layer.

A magnetic memory of the embodiment will be described hereinafter in accordance with the method for manufacturing the magnetic memory with reference to the accompanying drawings. In the drawings, the same portions are represented by the same reference numerals. Overlapping descriptions will be provided as needed.

FIG. 1 to FIG. 9 are cross-sectional views for illustrating the method for manufacturing the magnetic memory. The present embodiment explains a case where the magnetic memory is a magnetic random access memory (MRAM).

[FIG. 1]

An interlayer insulating film 101 is formed on a substrate 100 including a silicon substrate (not shown), and a contact plug 103 is formed in the interlayer insulating film 101 via a barrier metal film 102 by well-known damascene process.

The interlayer insulating film 101 is, for example, a silicon oxide film. The barrier metal film 102 includes, for example, a laminated film of a Ti film and a TiN film. A material of the contact plug 103 includes, for example, tungsten or titanium nitride, and has crystallinity. The barrier metal film 102 may be unnecessary depending on the material of the contact plug 103. An exposed surface 104 of the interlayer insulating film 101, the barrier metal film 102 and the contact plug 103 is planarized by CMP process of the damascene process.

A selection transistor (not shown) is formed on a surface of the silicon substrate. The selection transistor is an element for selecting an MTJ element. The selection transistor is, for example, a surrounding gate transistor (SGT). A gate insulating film and a gate electrode of the SGT are embedded in the surface of the silicon substrate. In the selection transistor, one of source/drain regions is connected to the contact plug 103, and the other source/drain region is connected to a plug 127 to be described later.

[FIG. 2]

A tantalum layer 105 as an underlying layer of the MTJ element is formed on the exposed surface 104 by sputtering process. The tantalum layer 105 includes a polycrystalline tantalum layer (first layer) 105p and an amorphous tantalum layer (second layer) 105a. The amorphous tantalum layer 105a is formed on the barrier metal film 102 and the contact plug 103.

The polycrystalline tantalum layer 105p is formed on the interlayer insulating film 101 and the amorphous tantalum layer 105a. In the early stage of formation of the tantalum layer 105, the polycrystalline tantalum layer 105p is formed on the barrier metal film 102 and the contact plug 103 under the influence of crystallinity of the material of the barrier metal film 102 and the contact plug 103. However, when a thickness of the polycrystalline tantalum layer 105p exceeds a certain value, the influence disappears and the amorphous tantalum layer 105a is also formed on the barrier metal film 102 and the contact plug 103.

The tantalum layer 105 has a structure of covering the polycrystalline tantalum layer 105p with the amorphous tantalum layer 105a. A surface of the tantalum layer 105 is the amorphous tantalum layer 105a, and the polycrystalline tantalum layer 105p is not exposed on the surface of the tantalum layer 105.

If the tantalum layer 105 of the thickness equal to or greater than the certain value is formed, the tantalum layer 105 having the above-described structure can be obtained. In the present embodiment, the thickness of the tantalum layer 105 is equal to or greater than 10 nm and, for example, equal to or greater than 20 nm. Since the tantalum layer 105 is formed on the planarized exposed surface (underlying layer) 104, the tantalum layer 105 having the uniform thickness equal to or greater than the certain value can be easily formed.

[FIG. 3]

A resist pattern 106 is formed on the tantalum layer 105 so as to process the tantalum layer 105 in a shape of the underlying layer, and the tantalum layer 105 is etched by using the resist pattern 106 as a mask. The etched tantalum layer 105 is hereinafter referred to as the underlying layer 105.

After that, a side surface (exposed surface) of the underlying layer 105 is oxidized, and a tantalum oxide film 107 is formed on the side surface of the underlying layer 105. The oxidation of the underlying layer 105 may be performed after the resist pattern 106 is removed. In this case, the tantalum oxide film 107 is formed on an upper surface and the side surface of the underlying layer 105. Preferably, the upper surface of the underlying layer 105 is not oxidized so as to reduce resistance between the underlying layer 105 and a magnetic layer to be formed on the underlying layer 105. If the oxide film is formed on the upper of the underlying layer 105 in FIG. 3, the oxide film is removed by this etching step. A surface of the amorphous tantalum layer 105a thus formed is excellent in flatness.

[FIG. 4]

Figure 3:
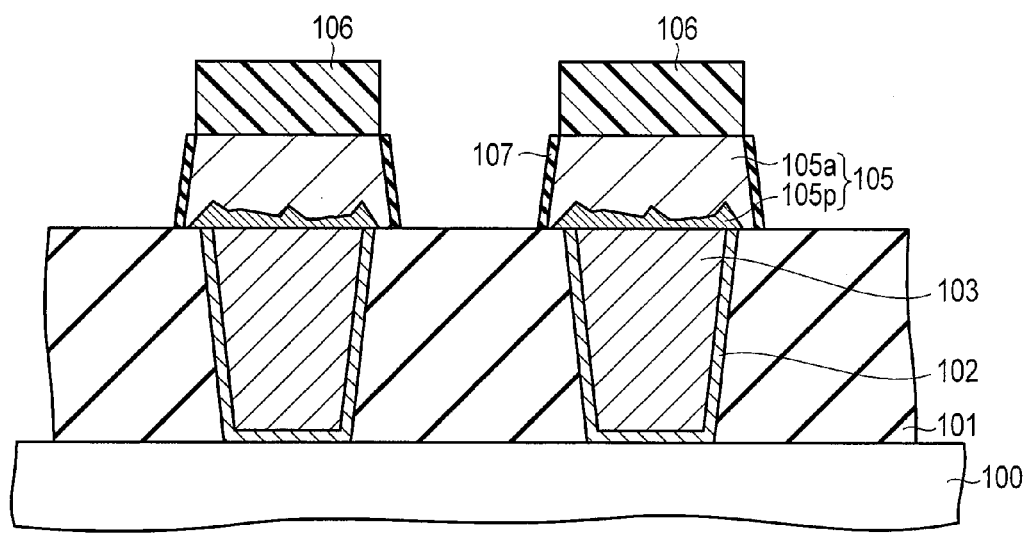
FIG. 3 is a cross-sectional view for illustrating the method for manufacturing the magnetic memory following FIG. 2.
Figure 4:
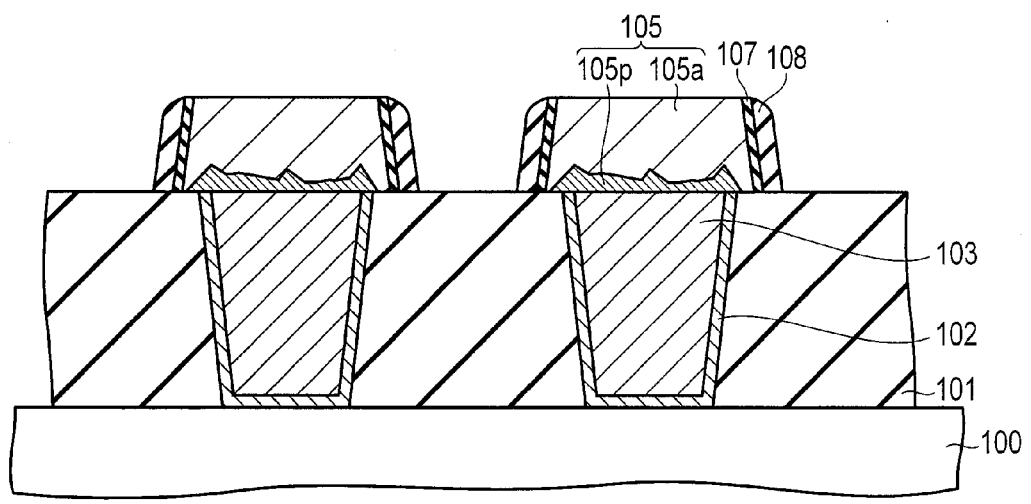
FIG. 4 is a cross-sectional view for illustrating the method for manufacturing the magnetic memory following FIG. 3.
Figure 5:
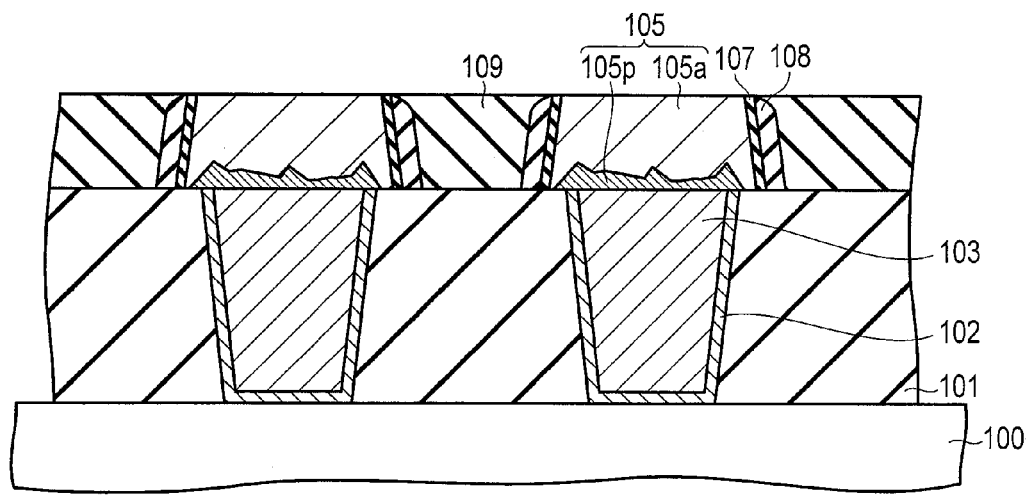
FIG. 5 is a cross-sectional view for illustrating the method for manufacturing the magnetic memory following FIG. 4.
Figure 6:
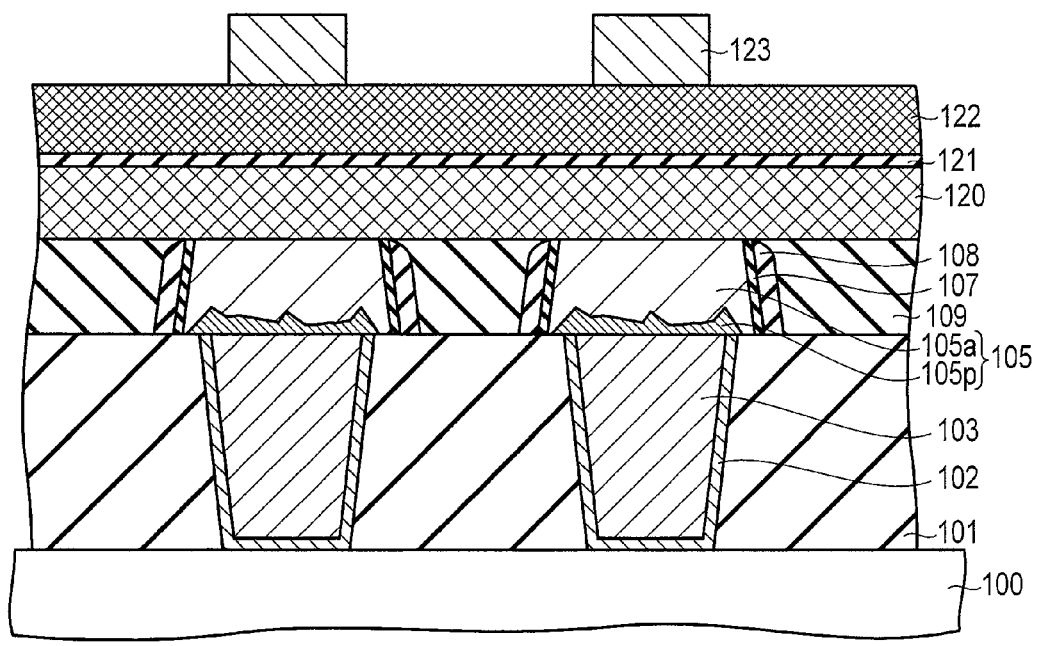
FIG. 6 is a cross-sectional view for illustrating the method for manufacturing the magnetic memory following FIG. 5.
Figure 8:
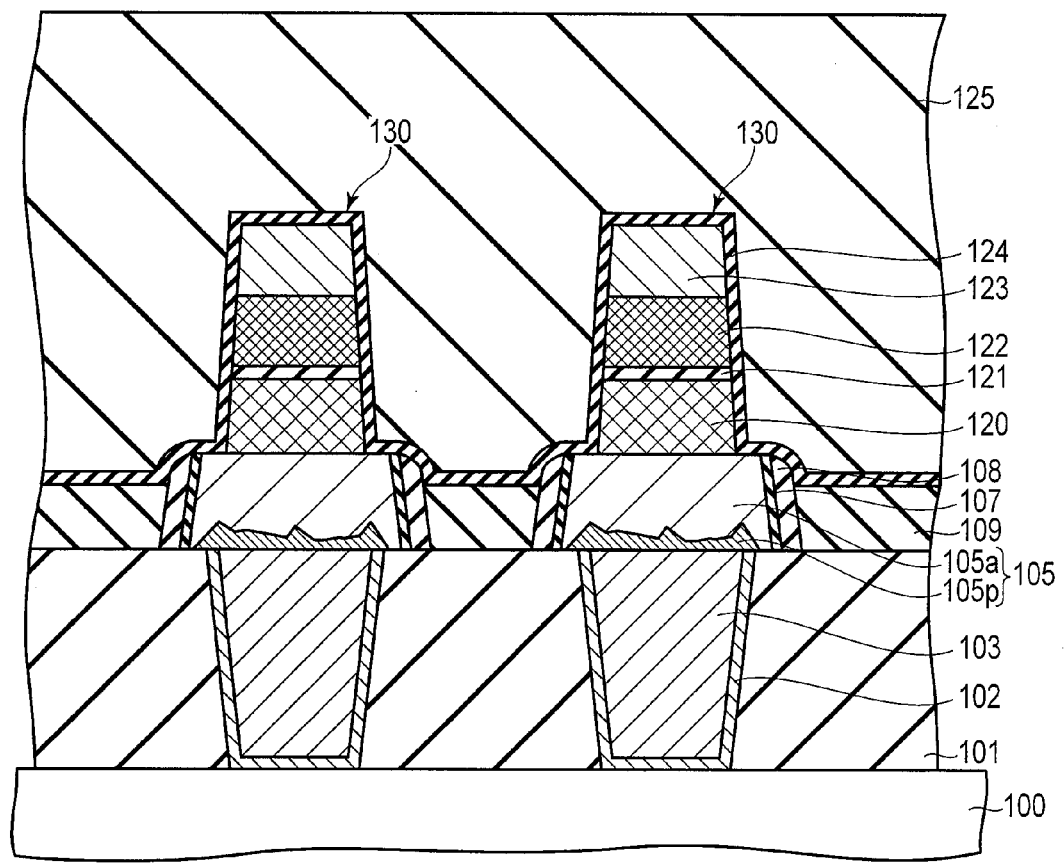
FIG. 8 is a cross-sectional view for illustrating the method for manufacturing the magnetic memory following FIG. 7.
Figure 9:
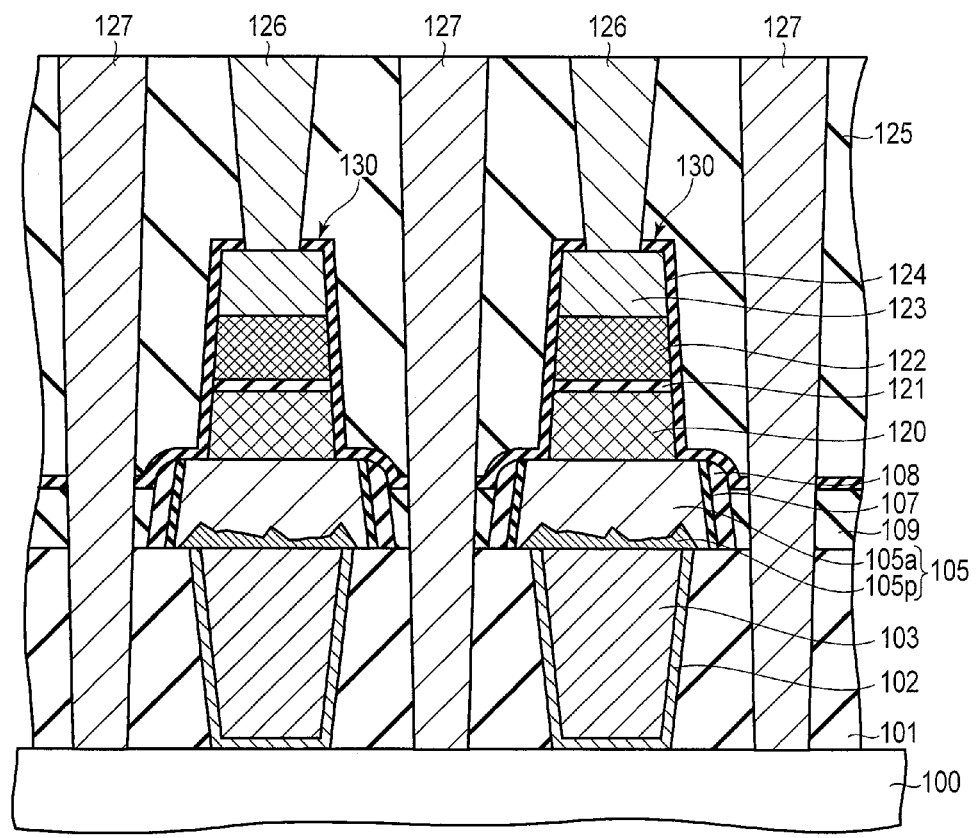
FIG. 9 is a cross-sectional view for illustrating the method for manufacturing the magnetic memory following FIG. 8.

After the resist pattern 106 shown in FIG. 3 is removed, a first sidewall insulating film 108 is formed on the side surface of the underlying layer 105 via the tantalum oxide film 107. A process for forming the first sidewall insulating film 108 includes a step of depositing an insulating film and a step of etching entire surface of the insulating film until the surface of the amorphous tantalum layer 105a is exposed. The insulating film is, for example, a silicon nitride film.

[FIG. 5]

An interlayer insulating film 109 is embedded between the underlying layers 105 by using a damascene process. A surface of a region including the underlying layer 105 and the interlayer insulating film 109 is planarized by the CMP process of the damascene process. The interlayer insulating film 109 is, for example, a silicon oxide film.

[FIG. 6]

Layers constituting an MTJ, including a first magnetic layer 120 as a memory layer, a tunnel barrier layer 121 and a second magnetic layer 122 as a reference layer are sequentially formed on the region (flat region) including the interlayer insulating film 109 and the underlying layer 105.

A layer constituting the MTJ other than the first magnetic layer 120, the tunnel barrier layer 121 and the second magnetic layer 122 is, for example, a shift cancelling layer (not shown). The shift cancelling layer is formed on the second magnetic layer 122. The first and second magnetic layers 120 and 122 may be the reference layer and the memory layer, respectively.

Since the first magnetic layer 120 is formed on the flat region, the first magnetic layer 120 and the other layers constituting the MTJ are formed flat.

After that, a hard mask 123 having electrical conductivity is formed on the second magnetic layer 122. The hard mask 123 is also formed flat. A material of the hard mask 123 is, for example, TiN, Ti, Ta or W. If the shift cancelling layer is on the second magnetic layer 122, the hard mask 123 is formed on the shift cancelling layer.

[FIG. 7]

The MTJ element 130 is formed by sequentially etching the second magnetic layer 122, the tunnel barrier layer 121 and the first magnetic layer 120 by using the hard mask 123 as a mask.

The etching is executed by using, for example, reactive ion etching (RIE), ion beam etching (IBE), or both RIE and IBE. FIG. 7 shows etching and lowering an upper surface of the interlayer insulating film 109 such that an upper portion (corner portion) of the first sidewall insulating film 108 is exposed. Actually, the amorphous tantalum layer 105a is also etched in addition to the interlayer insulating film 109. More specifically, the amorphous tantalum layer 105a is etched from an upper surface to a corner portion (not shown).

A plane pattern of the MTJ element 130 is, for example, circular or rectangular. In the present embodiment, a stacked body of the layers 120, 121, 122 and 123 constituting the MTJ element 130 has a tapered form having a width smaller toward the upper side.

The first magnetic layer 120 is provided on a partial region (first region) of the upper surface of the underlying layer 105 (amorphous tantalum layer 105a). In the present embodiment, the first region includes the center of the upper surface.

When the whole MTJ element 130 is arranged inside a closed curve defining a contour of the upper surface of the amorphous tantalum layer 105a, in other words, when the whole underlying layer of the MTJ element 130 is the amorphous tantalum layer 105a, high MTJ characteristics can be obtained since the MTJ 130 has a desirable crystal structure.

[FIG. 8]

A second sidewall insulating film 124 is formed on the entire surface on a side of the MTJ element 130 so as to cover sidewalls of the first magnetic layer 120, the tunnel barrier layer 121, the second magnetic layer 122 and the hard mask 123. The second sidewall insulating film 124 is, for example, a silicon nitride film.

In addition to the above mentioned sidewall, the second sidewall insulating film 124 covers an upper surface of the hard mask 123, the exposed upper surface and corner portion of the underlying layer 105 including a portion from the upper surface to the corner portion of the amorphous tantalum layer 105a etched in the step of FIG. 7 on which the first magnetic layer 120 is not provided, furthermore, the second sidewall insulating film 124 covers exposed surfaces of the tantalum oxide film 107, the first sidewall insulating film 108 and the interlayer insulating film 109 shown in FIG. 7. That is, the surfaces of the underlying layer 105, the tantalum oxide film 107, the first sidewall insulating film 108 and the interlayer insulating film 109 exposed in the step of FIG. 7 are covered with the second sidewall insulating film 124.

[FIG. 9]

An interlayer insulating film 125 is formed on the entire surface on a side of the MTJ element 130, and a surface of the interlayer insulating film 125 is planarized by CMP process. The interlayer insulating film 125 is, for example, a silicon oxide film. The interlayer insulating film 125 is formed by, for example, a CVD process.

A connection hole reaching the hard mask 125 is formed in the interlayer insulating film 125 and the second sidewall insulating film 124 by using a damascene process, and an upper electrode 126 is formed in this connection hole. Similarly, a connection hole reaching the other source/drain region (not shown) of the selection transistor is formed in the interlayer insulating film 125, the second sidewall insulating film 124 between the MTJ elements 130, the interlayer insulating film 109 and the interlayer insulating film 101 by using a damascene process, and a plug 127 is formed in the connection hole.

The plug 127 penetrates the second sidewall insulating film 124 between the MTJ elements 130. In the present embodiment, the second sidewall insulating film 124 has a portion which is extended to the outside of the first sidewall insulating film 108.

FIG. 10 is a graph showing a result of a research of a relationship between a thickness (UL thickness) of the underlying layer (tantalum layer) 105 and a standardized coersive force Hc of the first magnetic layer (memory layer) 120. When the thickness of the tantalum layer 105 becomes equal to or greater than 10 nm, the coersive force increases, and when the thickness of the underlying layer 105 becomes equal to or greater than 20 nm, the coersive force is sufficiently increases. Therefore, in the present embodiment, the thickness of the tantalum layer 105 is set to equal to or greater than 10 nm and, for example, equal to or greater than 20 nm, as described above. In the present embodiment, the tantalum layer having the thickness which allows the coersive force to be sufficiently large can be formed flat.

Figure 11:
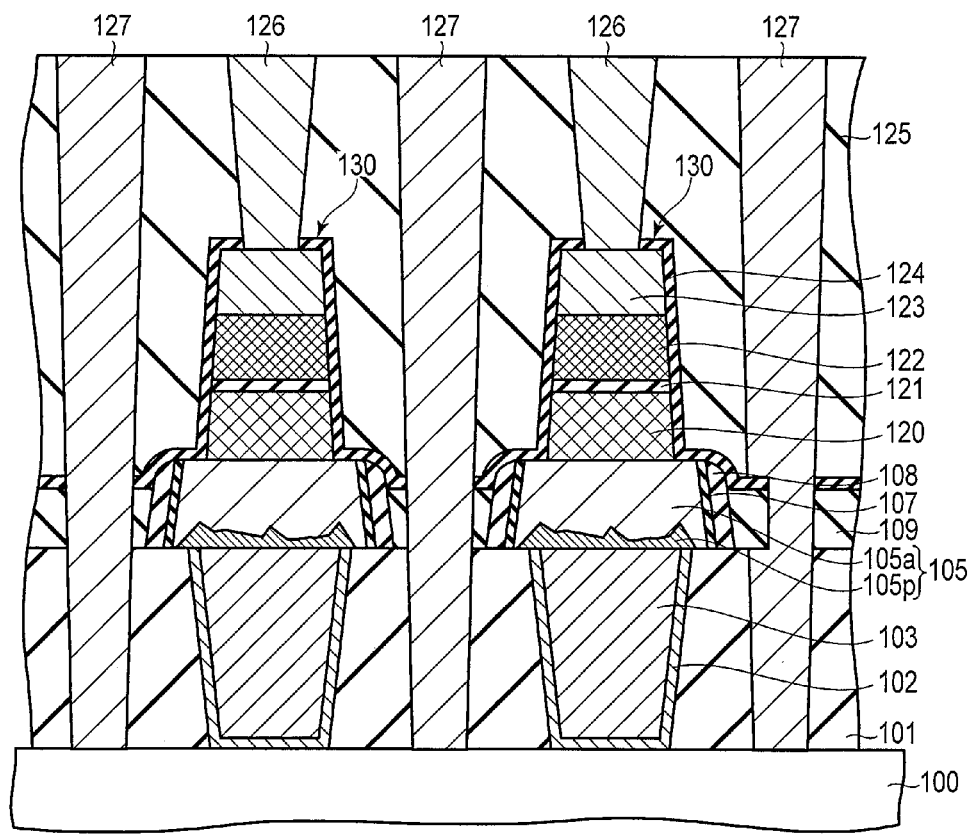
FIG. 11 is a cross-sectional view for illustrating a magnetic memory of another embodiment.

FIG. 11 is a cross-sectional view showing a magnetic memory of another embodiment. When miniaturization of the MRAM further progresses, the plug 127 may be formed to be closer to the underlying layer 105 due to a misalignment as shown in the MTJ element on the right side of FIG. 11. However, a short circuit between the plug 127 and the underlying layer 105 can be prevented because the first sidewall insulating film 108 covering the side surface of the underlying layer 105 and the second sidewall insulating film 124 covering the upper surface and the corner portion of the underlying layer 105 are present between the plug 127 and the underlying layer 105.

In the MTJ element on the right side of FIG. 11, the second sidewall insulating film 124 where is affected by misalignment loses a portion which is extended to the outside of the first sidewall insulating film 108, but the second sidewall insulating film 124 where is not affected by misalignment has the portion which is extended to the outside of the first sidewall insulating film 108.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic memory comprising:
   a substrate;
   an underlying layer having conductivity provided on the substrate and including a first layer of a polycrystalline structure and a second layer of an amorphous structure, wherein a thickness of the underlying layer is greater than or equal to 10 nm; and
   a magnetoresistive element provided on the underlying layer,
   the magnetoresistive element comprising:
      a first magnetic layer provided on the underlying layer;
      a non-magnetic layer provided on the first magnetic layer; and
      a second magnetic layer provided on the non-magnetic layer.

2. The magnetic memory according to claim 1, wherein the first and second layers include a same metallic element.

3. The magnetic memory according to claim 2, wherein the metallic element is tantalum.

4. The magnetic memory according to claim 1, wherein the second layer is thicker than the first layer.

5. The magnetic memory according to claim 1, wherein an upper surface of the underlying layer is flat.

6. The magnetic memory according to claim 1, wherein the second layer is provided on the first layer.

7. The magnetic memory according to claim 1, wherein the magnetoresistive element is provided on a partial region of an upper surface of the underlying layer.

8. The magnetic memory according to claim 1, further comprising a first sidewall insulating film provided on a side surface of the underlying layer.

9. The magnetic memory according to claim 8, further comprising a second sidewall insulating film, the second sidewall insulating film being provided on a side surface of the magnetoresistive element and being further provided on an upper surface of the underlying layer.

10. The magnetic memory according to claim 9, wherein the second sidewall insulating film extends to an outside of the first sidewall insulating film.

11. The magnetic memory according to claim 9, wherein the first sidewall insulating film includes a tantalum oxide film and the second sidewall insulating film includes a silicon nitride film.

12. The magnetic memory according to claim 1, further comprising a contact plug, wherein the underlying layer is formed on the contact plug.

13. The magnetic memory according to claim 1, further comprising an oxide film provided on a side surface of the underlying layer.

14. The magnetic memory according to claim 1, wherein the non-magnetic layer is a tunnel barrier layer.

\* \* \* \* \*